(12) United States Patent
Tiebout et al.

(10) Patent No.: US 12,057,871 B2
(45) Date of Patent: Aug. 6, 2024

(54) WIRELESS COMMUNICATION SYSTEM AND BASE STATION

(71) Applicant: Intel Corporation, Santa Clara, CA (US)

(72) Inventors: Marc Jan Georges Tiebout, Finkenstein (AT); Hazar Yuksel, San Francisco, CA (US); Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 18/062,030

(22) Filed: Dec. 6, 2022

(65) Prior Publication Data

US 2023/0198560 A1   Jun. 22, 2023

(51) Int. Cl.
*H04B 1/04* (2006.01)
*H04W 16/28* (2009.01)

(52) U.S. Cl.
CPC .......... *H04B 1/0475* (2013.01); *H04W 16/28* (2013.01); *H04B 2001/0425* (2013.01)

(58) Field of Classification Search
CPC ......... H04B 1/0475; H04B 2001/0425; H04W 16/28
See application file for complete search history.

(56) References Cited

U.S. PATENT DOCUMENTS

2009/0184763 A1* 7/2009 Kim ..................... H03F 3/68
330/124 R

2010/0254299 A1* 10/2010 Kenington ............. H04B 7/063
375/296

(Continued)

FOREIGN PATENT DOCUMENTS

GB   2569121 A   6/2019

OTHER PUBLICATIONS

E. Ng, Y. Beltagy, G. Scarlato, A. Ben Ayed, P. Mitran and S. Boumaiza, "Digital Predistortion of Millimeter-Wave RF Beamforming Arrays Using Low Number of Steering Angle-Dependent Coefficient Sets," in IEEE Transactions on Microwave Theory and Techniques, vol. 67, No. 11, pp. 4479-4492, Nov. 2019, doi: 10.1109/TMTT.2019.2924893.

(Continued)

*Primary Examiner* — Freshteh N Aghdam
(74) *Attorney, Agent, or Firm* — 2SPL Patent Attorneys PartG mbB; Kieran O'Leary

(57) ABSTRACT

A wireless communication system including a phased array comprising a plurality of antennas configured to emit a respective radio wave based on a respective antenna signal. Further, the system includes a plurality of power amplifiers each coupled to one of the plurality of antennas via a feed line and configured to output the antenna signal to the feed line. Also, the system includes a plurality of directional couplers each coupled into one of the feed lines and comprising a third port configured to output a fraction of a power received at a first port coupled to the power amplifier via the feed line, likewise a fourth port configured to output a fraction of a power received at a second port. Additionally, the system includes switching circuitry configured to alternately couple the third port to a first feedback receiver, and to alternately couple the fourth port to a second feedback receiver.

16 Claims, 4 Drawing Sheets

(56) References Cited

U.S. PATENT DOCUMENTS

| | | | | |
|---|---|---|---|---|
| 2011/0085490 | A1* | 4/2011 | Schlee | H04B 17/12 |
| | | | | 370/315 |
| 2020/0266772 | A1* | 8/2020 | Hosoda | H04B 1/0483 |
| 2020/0366254 | A1* | 11/2020 | Seo | H04L 27/01 |

OTHER PUBLICATIONS

Wang et al., "Digital Predistortion of 5G Massive MIMO Wireless Transmitters Based on Indirect Identification of Power Amplifier Behavior With OTA Tests", in IEEE Transactions on Microwave Theory and Techniques, vol. 68, No. 1, Jan. 2020.

M. Abdelaziz, L. Anttila, A. Brihuega, F. Tufvesson and M. Valkama, "Digital Predistortion for Hybrid MIMO Transmitters," in IEEE Journal of Selected Topics in Signal Processing, vol. 12, No. 3, pp. 445-454, Jun. 2018, doi: 10.1109/JSTSP.2018.2824981.

Y. Cao, A. B. Ayed, J. Xia and S. Boumaiza, "Uniformly Distributed Near-Field Probing Array for Enhancing the Performance of 5G Millimetre-wave Beamforming Transmitters," in IEEE Microwave and Wireless Components Letters, vol. 31, No. 6, Jun. 2021, doi: 10.1109/LMWC.2021.3067168.

H. Knapp et al., "Three-channel 77 GHz Automotive Radar Transmitter in Plastic Package," 2012 IEEE Radio Frequency Integrated Circuits Symposium, 2012, pp. 119-122, doi: 10.1109/RFIC.2012.6242245.

Tervo Nuutti et al., "Digital Predistortion of Phased-Array Transmitter With Shared Feedback and Far-Field Calibration", IEEE Transactions on Microwave Theory and Techniques, IEEE , USA, vol. 69, No. 1, Dec. 1, 2020, pp. 1000-1015, XP011829651, ISSN: 0018-9480, doi: 10.1109/TMTT.2020.3038193.

Liu Xin et al., "Energy-efficient power amplifiers and linearization techniques for massive MIMO transmitters: a review", Frontiers of Information Technology & Electronic Engineering, Zhejiang University Press, Heidelberg, vol. 21, No. 1, Jan. 1, 2020, pp. 72-96, XP037049046, ISSN: 2095-9184, doi: 10.1631/FITEE.1900467.

* cited by examiner

WIRELESS COMMUNICATION SYSTEM AND BASE STATION

CROSS-REFERENCE TO RELATED APPLICATION

This application claims priority to European Application 21215432.2, filed on Dec. 17, 2021. The content of this earlier filed application is incorporated by reference herein in its entirety.

BACKGROUND

In active phased arrays such as for 5G millimeter wave (mmWave), Power Amplifiers (PAs) face a beamsteering angle dependent load. Each PA response changes with beam direction change (in high power regime) due to load pull of different PAs and lack of space to insert a circulator (as deployed in todays 5G systems below 6 GHz).

Digital Pre-Distortion (DPD) offers various significant benefits, especially in improving the PA efficiency and increasing Root Mean Square (RMS) transmit power. Hence, there is a strong desire to enable DPD also for active phased arrays such as mmWave beamforming systems. However, the above described angle-dependent load modulation requires that the DPD is adapted according to the beamsteering angle. Furthermore, the DPD shall linearize the phased array beam output instead of each single PA output.

Conventional sub-6 GHz systems include an isolator between antenna and PA output in order to DPD linearize the PA without complexity of antenna to antenna coupling. The insertion loss of the isolator significantly reduces to the overall transmit efficiency of such a system.

Hence, there may be a demand for improved wireless communication systems.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
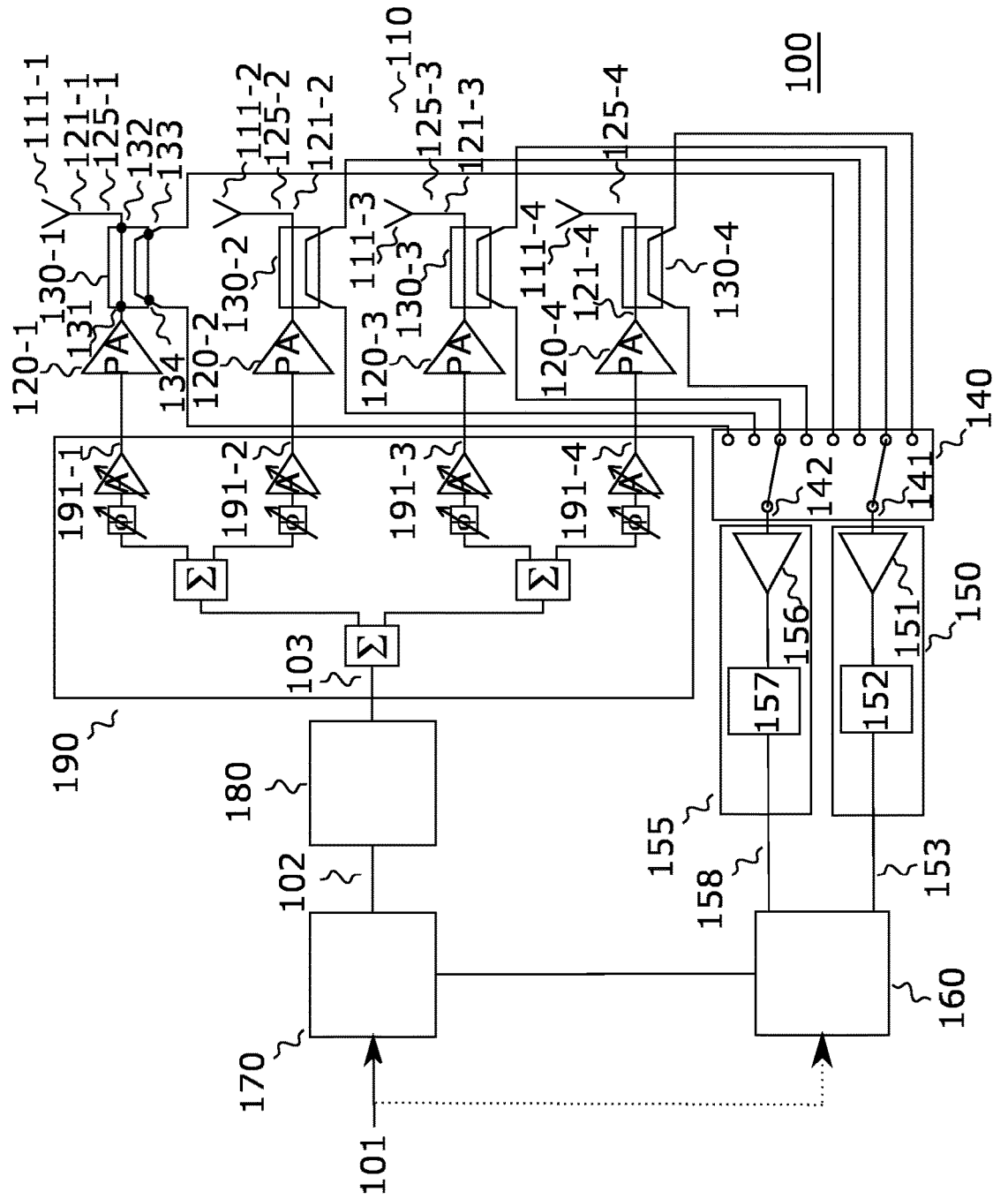
FIG. 1 illustrates an example of a wireless communication system.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates a wireless communication system 100 comprising a phased array 110. The wireless communication system 100 comprises a plurality of antennas 111-1, . . . , 111-4 forming the phased array 110. In the example of FIG. 1, four antennas are illustrated. However, it is to be noted that present disclosure is not limited thereto. In general any number n≥2 of antennas may be used. For example, the phased array 110 may comprise 4, 8, 16, 32, 64, 128 or more antennas.

The plurality of antennas 111-1, . . . , 111-4 may be arranged in a linear array (i.e. a one-dimensional array) as indicated in FIG. 1. In other examples, the plurality of antennas 111-1, . . . , 111-4 may be arranged in a planar array (i.e. a two-dimensional array). For example, the plurality of antennas 111-1, . . . , 111-4 may be patch antennas. However, the present disclosure is not limited thereto. The plurality of antennas 111-1, . . . , 111-4 may in general be any type of antenna.

The plurality of antennas 111-1, . . . , 111-4 are configured to receive a respective (analog) antenna signal 121-1, . . . , 121-4 and to emit a respective radio wave based on the respective antenna signal 121-1, . . . , 121-4. The radio waves emitted by the plurality of antennas interfere with each other such that at one or more solid angle constructive interference of the emitted radio waves occurs while at others destructive interference of the emitted radio waves occurs. Accordingly, one or more main beam (main lobe) is formed by interference of the emitted radio waves. Further, one or more side beams (side lobes) may occur due to the interference of the emitted radio waves.

The antenna signals 121-1, . . . , 121-4 are phase/delay and/or amplitude shifted with respect to each other such that also the emitted radio waves are phase and/or amplitude shifted with respect to each other. By shifting the phase/delay and/or amplitude of the antenna signals 121-1, . . . , 121-4 and, hence, the emitted radio waves, the one or more solid angle at which constructive interference of the emitted radio waves occurs may be controlled. In other words, the (spatial beam) direction of the one or more main beam formed by interference of the emitted radio waves may be controlled by shifting the phase/delay and/or amplitude of the antenna signals 121-1, . . . , 121-4 and, hence, the emitted radio waves. The direction of the main beam formed by interference of the emitted radio waves may also be denoted as beam angle or beamsteering angle.

Figure 4:
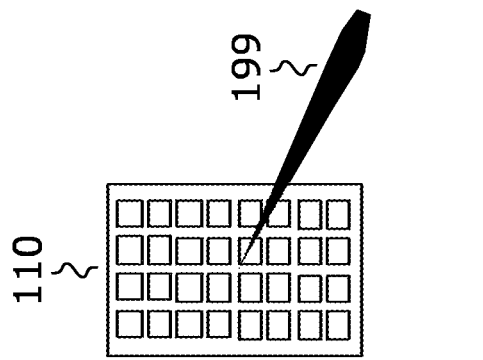
FIGS. 2 to 4 illustrate exemplary directions of a main beam emitted by a phased array.
Figure 3:
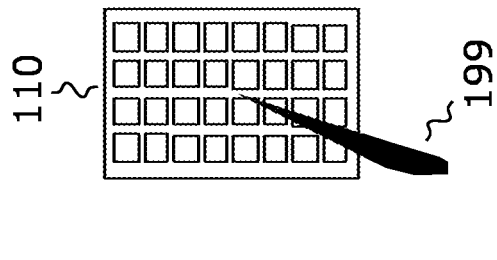
Figure 2:
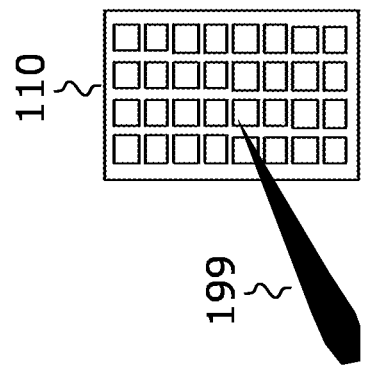

This is exemplarily illustrated in FIGS. 2 to 4. In FIG. 2, a first phase/delay and/or amplitude relation between the antenna signals 121-1, . . . , 121-4 is adjusted such that the main beam 199 formed by interference of the emitted radio waves is directed to a first spatial direction (the lower left). In FIG. 3, a different second phase/delay and/or amplitude relation between the antenna signals 121-1, . . . , 121-4 is adjusted such that the main beam 199 formed by interference of the emitted radio waves is directed to a second spatial direction, which is different from the first spatial direction. In FIG. 4, a different third phase/delay and/or amplitude relation between the antenna signals 121-1, . . . , 121-4 is adjusted such that the main beam 199 formed by interference of the emitted radio waves is directed to a third spatial direction (the lower right), which is different from the first spatial direction and the second spatial direction.

In the examples of FIGS. 2 to 4, the phased array comprises 32 antennas to highlight that the present disclosure is not limited four antennas as illustrated in FIG. 1.

Returning back to FIG. 1, the antenna signals 121-1, . . . , 121-4 are generated by a plurality of PAs 120-1, . . . , 120-4. The plurality of PAs 120-1, . . . , 120-4 are each coupled to a respective one of the plurality of antennas plurality of antennas 111-1, . . . , 111-4 via a respective feed line 125-1, . . . , 125-4. Each of the plurality of PAs 120-1, . . . , 120-4 is configured to output the respective antenna signal 121-1, . . . , 121-4 to the respective feed line 125-1, . . . , 125-4 to drive the respective associated antenna 111-1, . . . , 111-4.

Part of the power received by the respective antenna 111-1, . . . , 111-4 via the respective antenna signal 121-1, . . . , 121-4 is reflected back to the respective PA 120-1, . . . , 120-4 by the antenna. The amount of power reflected back to the respective PA is determined by the refection coefficient $\Gamma_i$ of the respective antenna. The respective refection coefficient $\Gamma_i$ for each individual antenna of the phased array 110 is defined as follows:

$$\Gamma_i = \frac{P_{ref,i}}{P_{fwd,i}} \quad (1)$$

$P_{fwd,i}$ denotes the forward power, i.e., the power output by the respective PA 120-1, . . . , 120-4 to the respective feed line 125-1, . . . , 125-4. $P_{ref,i}$ denotes the reflected power, i.e., the power reflected back to the feed line 125-1, . . . , 125-4 and, hence, the respective PA 120-1, . . . , 120-4 by the respective antenna 111-1, . . . , 111-4.

The power reflected back to the respective PA 120-1, . . . , 120-4 loads the respective PA 120-1, . . . , 120-4. The amount of power reflected back to the respective PA 120-1, . . . , 120-4 depends on the (spatial beam) direction of the one or more main beam formed by interference of the emitted radio waves. In other words, the amount of power reflected back to the respective PA 120-1, . . . , 120-4 depends on the phase and/or amplitude relation between the antenna signals 121-1, . . . , 121-4. Accordingly, a beam angle-dependent load modulation occurs.

The beam angle-dependent modulation of the load seen by the plurality of PAs 120-1, . . . , 120-4 may be compensated or at least mitigated by DPD. For adjusting the DPD to the beam angle-dependent load modulation, information about the forward power and the reflected power is needed.

For providing the information about the forward power and the reflected power, the wireless communication system 100 comprises a plurality of directional couplers 130-1, . . . , 130-4 and switching circuitry 140.

As illustrated in FIG. 1, each of the plurality of directional couplers 130-1, . . . , 130-4 is coupled into a respective one of the feed lines 125-1, . . . , 125-4.

Each of the directional couplers 130-1, . . . , 130-4 comprises a respective first port coupled to the respective power amplifier via the respective feed line 125-1, . . . , 125-4. Further, each of the directional couplers 130-1, . . . , 130-4 comprises a respective second port coupled to the respective antenna 111-1, . . . , 111-4 via the respective feed line 125-1, . . . , 125-4.

The power output by the respective PA 120-1, . . . , 120-4 to the respective feed line 125-1, . . . , 125-4 via the respective antenna signal 121-1, . . . , 121-4 is received at the respective first port of each directional coupler 130-1, . . . , 130-4. Each of the directional couplers 130-1, . . . , 130-4 comprises a respective third port configured to output a fraction of the respective power received at the respective first port of the directional coupler.

The power reflected back to the respective feed line 125-1, . . . , 125-4 and, hence, the respective PA 120-1, . . . , 120-4 by the respective antenna 111-1, . . . , 111-4 is received at the respective second port of each directional coupler 130-1, . . . , 130-4. Each of the directional couplers 130-1, . . . , 130-4 comprises a respective fourth port configured to output a fraction of the respective power received at the respective second port of the directional coupler.

The above is exemplarily illustrated in FIG. 1 for the directional coupler 130-1 coupled into the feed line 125-1 coupling the PA 120-1 and the antenna 111-1. The PA 120-1 outputs the antenna signal 121-1 to the feedline 125-1. The first port 131 of the directional coupler 130-1 is coupled to the output of the PA 120-1 via the feedline 125-1 and receives the antenna signal 121-1. The antenna signal 121-1 passes the directional coupler 120-1 and is output to the feedline 125-1 at the second port 132 of the directional coupler 130-1 such that is propagates to the antenna 111-1, which is coupled to the second port 132 of the directional coupler 130-1. Part of the antenna signal 121-1' power is coupled out from the antenna signal 121-1 by the directional coupler 130-1, and is output at the third port 133 of the directional coupler 130-1. Analogously, the second port 132 of the directional coupler 130-1 receives via the transmission line 125-1 the power reflected back by the antenna 111-1. The reflected power passes the directional coupler 120-1 and is output to the feedline 125-1 at the first port 131 of the directional coupler 130-1 such that is propagates to the PA 120-1 and loads the PA 120-1. Part of the reflected power is coupled out by the directional coupler 130-1, and is output at the fourth port 134 of the directional coupler 130-1.

The switching circuitry 140 is coupled to the respective third port of the plurality of directional couplers 130-1, . . . , 130-4 and the respective fourth port of the plurality of directional couplers 130-1, . . . , 130-4. Further, the switching circuitry 140 is coupled to a first feedback receiver 150 and a second feedback receiver 155. The switching circuitry 140 is configured to alternately couple the respective third port of one of the plurality of directional couplers 130-1, . . . , 130-4 to the first feedback receiver 150. Further, the switching circuitry 140 is configured to alternately couple the respective fourth port of one of the plurality of directional couplers 130-1, . . . , 130-4 to the second feedback receiver 140. In particular, the switching circuitry 140 is configured to simultaneously couple the respective third port and the respective fourth port of the respective one of the plurality of directional couplers 130-1, . . . , 130-4 to the respective one of the first feedback receiver 150 and the second feedback receiver 155. For example, the switching circuitry 140 may first simultaneously couple the third port 133 and the fourth port 134 of the directional coupler 130-1 to the respective one of the first feedback receiver 150 and the second feedback receiver 155, then simultaneously couple the third port and the fourth port of the directional coupler 130-2 to the respective one of the first feedback receiver 150 and the second feedback receiver 155, then simultaneously couple the third port and the fourth port of the directional coupler 130-3 to the respective one of the first feedback receiver 150 and the second feedback receiver 155, and then simultaneously couple the third port and the fourth port of the directional coupler 130-4 to the respective one of the first feedback receiver 150 and the second feedback receiver 155. However, it is to be noted that the present disclosure is not limited thereto. In other examples, the switching circuitry 140 may use another order (sequence) for coupling the respective third port and the respective fourth port of the plurality of directional couplers 130-1, . . . , 130-4 to the respective one of the first feedback receiver 150 and the second feedback receiver 155.

The switching circuitry 140 may, e.g., comprise a plurality of semiconductor switches such as a plurality of transistors or a plurality of transistor networks for the selective coupling of the individual ports of the directional couplers 130-1, . . . , 130-4 to the respective one of the first feedback receiver 150 and the second feedback receiver 155.

The plurality of directional couplers 130-1, . . . , 130-4 and the switching circuitry 140 allow to extract for each PA 120-1, . . . , 120-4 the forward power, i.e., the power output by the respective PA 120-1, . . . , 120-4 to the respective feed line 125-1, . . . , 125-4. Analogously, the plurality of directional couplers 130-1, . . . , 130-4 and the switching circuitry 140 allow to extract for each PA 120-1, . . . , 120-4 the reflected power, i.e. the power reflected back to the feed line 125-1, . . . , 125-4 and, hence, the respective PA 120-1, . . . , 120-4 by the respective antenna 111-1, . . . , 111-4. The information for each PA 120-1, . . . , 120-4 about the respective forward power and the respective reflected power allow to adjust DPD for the wireless system, which will be explained below with more details.

The first feedback receiver 150 and the second feedback receiver 155 are schematically illustrated in FIG. 1.

The first feedback receiver 150 comprises an amplifier or attenuator 151 (e.g. a Low Noise Amplifier, LNA, or a programmable attenuator such as a Digital Step Attenuator, DSA) configured to amplify or attenuate a first output (signal) 141 of the switching circuitry 140. The first output 141 is based on (corresponds to) the power (signal) output by the respective third port coupled to the first feedback receiver 150 by the switching circuitry 140. The first feedback receiver 150 further comprises circuitry 152 for processing the amplified first output 141. The further circuitry 152 may comprise various circuitry such as one or more filter, one or more Analog-to-Digital Converter (ADC), an equalizer, one or more mixer (down-converter or IQ down-converter), etc. The first feedback receiver is configured to generate a first digital feedback signal 153 based on the first output 141. The first digital feedback signal 153 is indicative of the forward power of the respective PA 120-1, . . . , 120-4, i.e., the power output by the respective PA 120-1, . . . , 120-4 to the respective feed line 125-1, . . . , 125-4.

Analogously, the second feedback receiver 155 comprises an amplifier or attenuator 156 (e.g. an LNA or a DSA) configured to amplify or attenuate a second output (signal) 142 of the switching circuitry 140. The second output 142 is based on (corresponds to) the power (signal) output by the respective fourth port coupled to the second feedback receiver 155 by the switching circuitry 140. The second feedback receiver 155 further comprises circuitry 157 for processing the amplified second first output 142. The further circuitry 157 may comprise various circuitry such as one or more filter, one or more ADC, an equalizer, one or more mixer (down-converter or IQ down-converter), etc. The second feedback receiver 155 is configured to generate a second digital feedback signal 158 based on the second output 142. The second digital feedback signal 158 is indicative of the reflected power loading the respective PA 120-1, . . . , 120-4, i.e. the power reflected back to the feed line 125-1, . . . , 125-4 and, hence, the respective PA 120-1, . . . , 120-4 by the respective antenna 111-1, . . . , 111-4.

Training circuitry 160 is coupled to the first feedback receiver 150 and the second feedback receiver 155. For example, the training circuitry 160 may be a single dedicated processor, a single shared processor, or a plurality of individual processors, some of which or all of which may be shared, a digital signal processor (DSP) hardware, an application specific integrated circuit (ASIC) or a field programmable gate array (FPGA). The training circuitry 160 may optionally be coupled to, e.g., read only memory (ROM) for storing software, random access memory (RAM) and/or non-volatile memory. The training circuitry 160 is configured to receive the first digital feedback signal 153 and the second digital feedback signal 158. Further, the training circuitry 160 is configured to determine (calculate) one or more pre-distortion coefficient based on the first digital feedback signal 153 and the second digital feedback signal 158.

The one or more distortion coefficient are used by DPD circuitry 170 for pre-distorting a digital transmit signal 101. The digital transmit signal 101 may, e.g., be a baseband signal or a digital signal derived therefrom. Similar to the training circuitry 160, the DPD circuitry 170 may, e.g., be a single dedicated processor, a single shared processor, or a plurality of individual processors, some of which or all of which may be shared, a DSP hardware, an ASIC or a FPGA. Although illustrated as separate elements in FIG. 1, the training circuitry 160 and the DPD circuitry 170 may be implemented integrally in other examples of the present disclosure. The DPD circuitry 170 is configured to receive the digital transmit signal 101 and to pre-distort the digital transmit signal 101 using the one or more pre-distortion coefficient. The DPD circuitry 170 is further configured to output a pre-distorted digital transmit signal 102.

As indicated in FIG. 1, also the training circuitry 160 may optionally be configured to receive the digital transmit signal 101. Accordingly, the training circuitry 160 may be configured to determine the one or more pre-distortion coefficient further based on the digital transmit signal 101. Alternatively or additionally, the training circuitry 160 may optionally be configured to receive the pre-distorted digital transmit signal 102 and to determine the one or more pre-distortion coefficient further based on the pre-distorted digital transmit signal 102.

The wireless communication system 100 further comprises a transmitter 180 configured to receive the pre-distorted digital transmit signal 102. The transmitter 180 is further configured to generate an analog radio frequency signal 103 based on the pre-distorted digital transmit signal 102. The transmitter 180 may comprise various circuitry such as one or more filter, a Digital-to-Analog Converter (DAC), one or more mixer (up-converter), etc.

Additionally, the wireless communication system 100 comprises beamforming circuitry 190 coupled to the transmitter 180 and the plurality of PAs 120-1, . . . , 120-4. The beamforming circuitry 190 is configured to generate a plurality of radio frequency transmit signals 191-1, . . . , 191-4 for the plurality of PAs 120-1, . . . , 120-4 based on the analog radio frequency signal 103 output by the transmitter 180, i.e., effectively based on the pre-distorted digital transmit signal 102. As illustrated in FIG. 1, the beamforming circuitry 190 is configured to generate a respective radio frequency transmit signal 191-1, . . . , 191-4 for each of the plurality of PAs 120-1, . . . , 120-4.

Each of the plurality of PAs 120-1, . . . , 120-4 receives the radio frequency transmit signal 191-1, . . . , 191-4 from the beamforming circuitry 190. The plurality of PAs 120-1, . . . , 120-4 are configured to generate the antenna signals 121-1, . . . , 121-4 by amplifying the plurality of radio frequency transmit signals 191-1, . . . , 191-4. Accordingly, the antenna signals 121-1, . . . , 121-4 are based on the digital transmit signal 101/the pre-distorted digital transmit signal 102.

The beamforming circuitry 190 is configured to adjust a respective phase/delay and/or a respective amplitude of the radio frequency transmit signals 191-1, . . . , 191-4 for controlling the direction (i.e. the beam angle) of the main beam formed by interference of the corresponding radio waves emitted by the antennas 111-1, . . . , 111-4. For example, the beamforming circuitry 190 may comprise a plurality of phase shifters/delay circuits and/or amplitude shifters for adjusting the respective phase/delay and/or the respective amplitude of the radio frequency transmit signals 191-1, . . . , 191-4. However, it is to be noted that the present disclosure is not limited to the specific analog beamforming circuitry 190 illustrated in FIG. 1. In general, any beamforming circuitry configured to perform the above described functionality may be used.

In the example of FIG. 1, the beamforming circuitry 190 is implemented as analog beamforming circuitry. However, the present disclosure is not limited thereto. In alternative examples, the beamforming circuitry 190 may be implemented as digital beamforming circuitry which performs the phase and/or amplitude adjustment in the digital domain rather than in the analog domain. Accordingly, the analog-to-digital conversion performed by the transmitter 180 in the example of FIG. 1 may be performed subsequent to the phase and/or amplitude adjustment in the digital domain.

The training circuitry 160 may use one or more training model or algorithm for determining the one or more pre-distortion coefficient based on the first digital feedback signal 153 and the second digital feedback signal 158 (and optionally further the digital transmit signal 101 and/or the pre-distorted digital transmit signal 102). For example, the training circuitry 160 may be configured to determine the one or more pre-distortion coefficient using a training model for minimizing an overall non-linear distortion of the main beam formed by interference of the radio waves emitted by the antennas 111-1, . . . , 111-4. In other words, the training circuitry 160 may be configured to determine the one or more pre-distortion coefficient such that the overall non-linear distortion of the main beam is minimized rather than individual non-linear distortions of the individual PAs 120-1, . . . , 120-4. Accordingly, one or more of the plurality of the PAs 120-1, . . . , 120-4 may exhibit a rather high individual non-linear distortion despite the DPD. However, this is negligible as the overall non-linear distortion of the main beam is minimized. In other words, the training circuitry 160 may use a training model aiming to minimize the combined non-linearity of all the PAs 120-1, . . . , 120-4 rather than the individual non-linearities of single ones of the plurality of the PAs 120-1, . . . , 120-4.

Those skilled in the art are aware of suitable training models or algorithms for determining one or more pre-distortion coefficient based on at least a first digital signal indicative of the forward power of the respective PA and a second digital signal indicative of the reflected power loading the respective PA. Therefore, only a few explanations will be given in the following with respect to the determination of the one or more pre-distortion coefficient.

As described above, the second digital feedback signal 158 is indicative of the reflected power loading the respective PA 120-1, . . . , 120-4. Hence, the second digital feedback signal 158 allows to determine (characterize) the load modulation of the plurality of PAs 120-1, . . . , 120-4. Accordingly, the training circuitry 160 may be configured to determine a load modulation of the plurality of PAs 120-1, . . . , 120-4 based on the second digital feedback signal 158. In other words, the beam angle-dependent load of the plurality of PAs 120-1, . . . , 120-4 may be determined based on the second digital feedback signal 158. Accordingly, the one or more pre-distortion coefficient may be determined by the training circuitry 160 based on the determined load modulation of the plurality of PAs 120-1, . . . , 120-4.

As described above, the first digital feedback signal 153 is indicative of the forward power of the respective PA 120-1, . . . , 120-4. Hence, the first digital feedback signal 153 allows to determine the far field radiation pattern of the phased array 110. While the near field of the phased array 110 is the region right next to the phased array 110 (i.e. the immediate vicinity of the phased array 110), the far field of the phased array 110 is the region that comes after the near field. An intended recipient of the radio waves emitted by the phased array 110 (e.g. a mobile phone) is usually located in the far field region of the phased array 110. Accordingly, the training circuitry 160 may be configured to determine the far field radiation pattern of the phased array 110 based on the first digital feedback signal 153. Accordingly, the one or more pre-distortion coefficient may be determined by the training circuitry 160 based on the determined far field radiation pattern. For example, techniques such as anti-beamforming may be used by the training circuitry 160 to determine the far field radiation pattern. However, it is to be noted that the present disclosure is not limited thereto. Other techniques may be used as well.

One or more antenna of the phased array may further be used for measuring the near field radiation pattern of the phased array 110. For example, one (or more) of the plurality of PAs 120-1, . . . , 120-4 may be configured (controlled) to provide no antenna signal to the respective antenna of the phased array 110 during a time slot, i.e., during a given period of time. Accordingly, the respective antenna of the phased array 110 does not emit a radio wave during the time slot and may, hence, be used as probe for measuring the near field radiation pattern of the phased array 110. The switching circuitry 140 may be configured to couple the fourth port of the directional coupler coupled to the one of the plurality of PAs (not providing an antenna signal to respective antenna of the phased array 110) during the time slot to the second feedback receiver 155. For example, the PA 120-1 may be configured to provide no antenna signal to the antenna 111-1 during the time slot such that the antenna 111-1 can be used as probe for measuring the near field radiation pattern of the phased array 110. Accordingly, the switching circuitry 140 may be configured to couple the fourth port 134 of the directional coupler 130-1 during the time slot to the second feedback receiver 155. As a consequence, a signal section of the second digital feedback signal 158, which is generated by the second feedback receiver 155 based on the second output (signal) 142 of the switching circuitry during the time slot, is indicative of the near field radiation pattern of the phased array 110.

The training circuitry 160 may accordingly be configured to determine the near field radiation pattern of the phased array 110 based on the signal section of the second digital feedback signal 158, which is generated by the second digital feedback signal 155 based on the second output (signal) 142 of the switching circuitry during the time slot. The one or more pre-distortion coefficient may be determined by the training circuitry 160 based on the determined near field radiation pattern of the phased array 110.

According to the present disclosure, a respective coupler measuring incoming and outgoing wave on each PA is used. This elegantly solves the area problem or small number of receiving antennas, and allows to capture PA loading depending on the bemasteering angle.

The wireless communication system 100 may be used for various beamforming applications. For example, the wireless communication system 100 may be used for millimeter wave applications such as 5G mmWave. Accordingly, the radio waves emitted by the plurality of antennas 111-1, . . . , 111-4 of the phased array 110 may be millimeter waves. In other words, the radio waves emitted by the plurality of antennas 111-1, . . . , 111-4 of the phased array 110 may exhibit a frequency of 24 GHz or more. The proposed architecture may enable DPD on mmWave phased arrays and, hence, enable an increased RMS transmit power and much higher power efficiency (e.g., up to 20%) resulting in very significant power saving for wireless operators. Also, system thermal design may be drastically simplified, translating into lower costs for base station suppliers.

Figure 5:
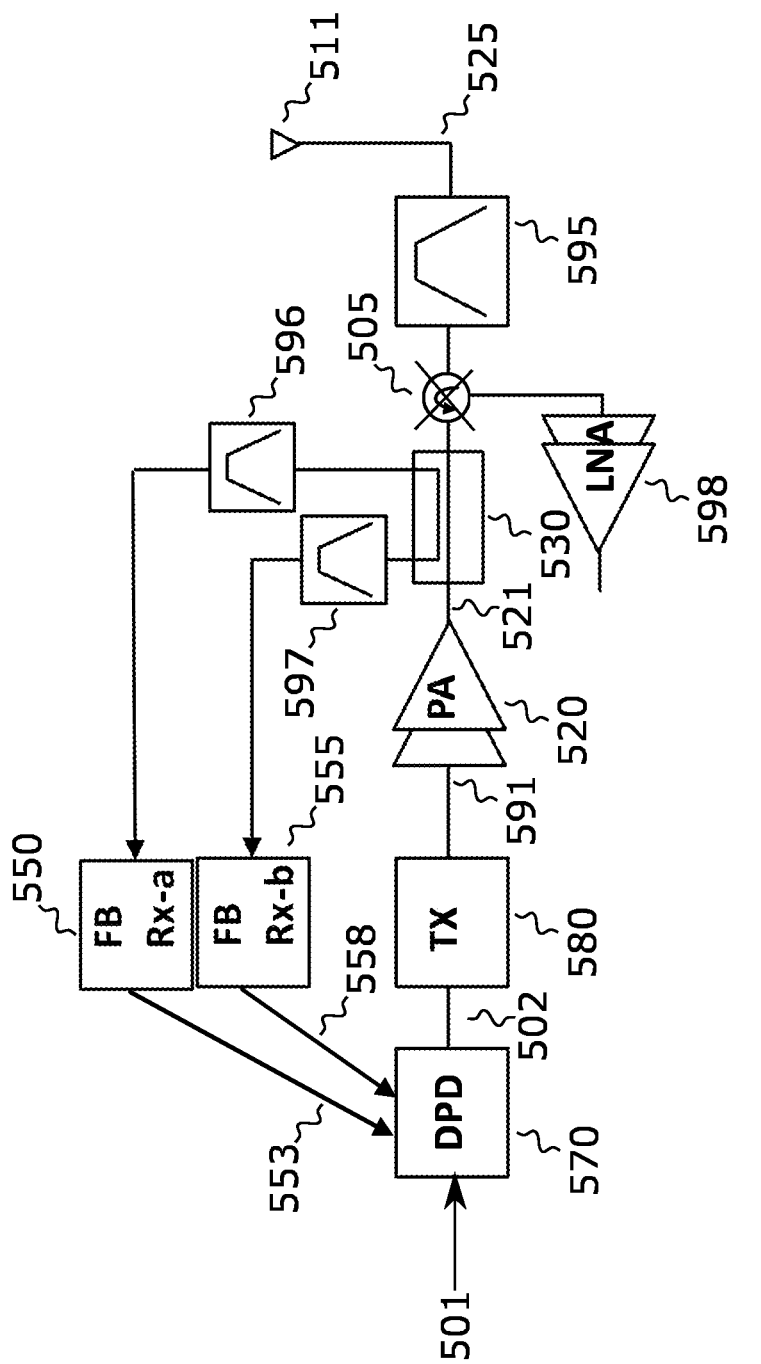
FIG. 5 illustrates an example of another wireless communication system or a single channel of such a system.

However, the present disclosure is not limited to millimeter wave applications. The wireless communication system 100 may be used for emitting radio waves of shorter wavelength (i.e. lower frequency) as well. For example, the wireless communication system 100 may be used for sub-6 GHz applications such as classical cellular communication. Accordingly, the radio waves emitted by the plurality of antennas 111-1, . . . , 111-4 of the phased array may exhibit a frequency of 6 GHz or less. The further benefits of the present architecture for sub-6 GHz wireless communication will become evident from the example of FIG. 5. FIG. 5 illustrates another wireless communication system 500 according to the present disclosure for sub-6 GHz wireless communication. For reasons of simplicity, only a single antenna 511 together with the corresponding transmit path circuitry is illustrated in FIG. 5. However, it is to be noted that the wireless communication system 500 may comprise a plurality of antennas and transmit paths similar to what is described below.

Similar to what is described above, the wireless communication system 500 comprises DPD circuitry 570 configured to receive a digital transmit signal 501 and to pre-distort the digital transmit signal 501 using one or more pre-distortion coefficient. A transmitter 580 receives the pre-distorted digital transmit signal 502 and generates an analog radio frequency transmit signal 591. The transmitter 580 may comprise various circuitry such as one or more filter, a DAC, one or more mixer (up-converter), etc. In the example of FIG. 5, the beamforming circuitry for adjusting a phase and/or an amplitude of the analog radio frequency transmit signal 591 is included in the transmitter 580 for reasons of simplicity.

A PA 520 receives the analog radio frequency transmit signal 591 and generates an antenna signal 521 for the antenna 511 by amplifying the analog radio frequency transmit signal 591. The PA 520 outputs the antenna signal 521 to a feedline 525 coupling the antenna 511 and the PA 520. A bandpass filter 595 is coupled into the feedline 525. Further, a directional coupler 530 is coupled into the feedline 525 analogously to what is described above.

A first port of the directional coupler 530 is coupled to the output of the PA 520 via the feedline 525 and receives the antenna signal 521. The antenna signal 521 passes the directional coupler 530 and is output to the feedline 525 at a second port of the directional coupler 530 such that is propagates to the antenna 511, which is coupled to the second port of the directional coupler 530. Part of the antenna signal 521' power is coupled out from the antenna signal 521 by the directional coupler 530, and is output at a third port of the directional coupler 530. Analogously, the second port of the directional coupler 530 receives via the transmission line 525 the power reflected back by the antenna 511. The reflected power passes the directional coupler 530 and is output to the feedline 525 at the first port of the directional coupler 530 such that is propagates to the PA 520 and loads the PA 520. Part of the reflected power is coupled out by the directional coupler 530, and is output at a fourth port of the directional coupler 530.

The third port of the directional coupler 530 is coupled to a first feedback receiver 550. The fourth port of the directional coupler 530 is coupled to a second feedback receiver 555. In the example of FIG. 5, no switching circuitry is illustrated for reasons of simplicity as only a single transmit path is illustrated. It is evident from the above description that the feedback receivers 550 and 555 may be shared among multiple transmit paths (e.g. four or more) and be coupled to the respective transmit path via switching circuitry. Further illustrated are two bandpass filters 596 and 597 coupled between the directional coupler 530 and the respective one of the first feedback receiver 550 and the second feedback receiver 555.

The first feedback receiver 550 generates a first digital feedback signal 553 based on the power received from the third port of the directional coupler 530. Analogously, the second feedback receiver 555 generates a second digital feedback signal 558 based on the power received from the fourth port of the directional coupler 530.

The power output at the third port of the directional coupler 530 and, hence, the first digital feedback signal 553 is indicative of the forward power of the PA 520, i.e., the power output by the PA 520 to the feed line 525. The power output at the fourth port of the directional coupler 530 and, hence, the second digital feedback signal 558 is indicative of the reflected power loading the PA 520, i.e. the power reflected back to the feed line 525 and, hence, the PA 520 by the antenna 511. The first digital feedback signal 553 and the second digital feedback signal 558 are supplied to the DPD circuitry 570, which includes the above described training circuitry. Accordingly, the one or more pre-distortion coefficient are determined based on the first digital feedback signal 553 and the second digital feedback signal 558.

Measuring the forward power and the reflected power enables linearization of the PA 520 and beamforming by means of DPD according to the above described principles. Contrary to conventional sub-6 GHz systems, the proposed architecture allows to omit an isolator 505 between the PA 520 and the antenna 511. The insertion loss of the isolator 505 would significantly reduce to the overall transmit efficiency of the system. Accordingly, the proposed architecture allows to increase the overall transmit efficiency also for sub-6 GHz systems.

A receive path coupled to the antenna 511 is indicated by the LNA 598 coupled to the feedline 525 between the PA 520 and the antenna 511.

Figure 6:
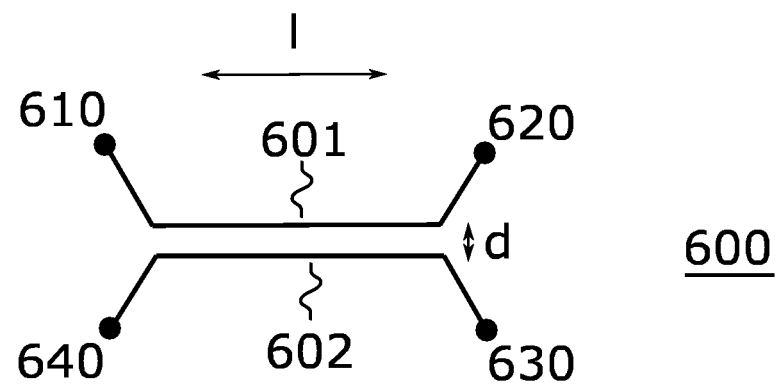
FIG. 6 illustrates an example of a directional coupler.

FIG. 6 illustrates an exemplary directional coupler 600 which may be used in a wireless communication system according to one or more aspect of the architecture described above. However, it is to be noted that wireless communication systems according to the present disclosure are not limited to using the directional coupler 600. Other directional coupler structures may be used as well for the plurality of directional couplers.

The directional coupler 600 comprises a first transmission line 601 coupling a first port 610 and a second port 620. Further, the directional coupler 600 comprises a second transmission line 702 coupling the a third port 630 and a fourth port 640.

The first transmission line 601 and the second transmission line 602 are spaced apart from each other at a distance d enabling power passing through one of the first transmission line 601 and the second transmission line 602 to couple into the other one of the first transmission 601 line and the second transmission line 602.

For example, if the first port 610 is coupled to a PA and the second port 620 is coupled to an antenna as described above, the first port 610 receives power output from the PA. The power passes through the first transmission line 601 to the second port 620, where it is output to the antenna. Due to the spacing of the first transmission line 601 and the second transmission line 602, a fraction of the power received from the PA couples into the second transmission line 602 and can be extracted at the third port 630 for further processing as described above. Analogously, the second port 620 receives power reflected back by the antenna. The power passes through the first transmission line 601 to the first port 610, where it is output to the PA and loads the PA. Due to the spacing of the first transmission line 601 and the second transmission line 602, a fraction of the power received from the antenna couples into the second transmission line 602 and can be extracted at the fourth port 640 for further processing as described above.

A length l of the coupled straight sections of the first transmission line 601 and the second transmission line 602 may be $\lambda/4$, wherein $\lambda$ denotes a wavelength of the power passing through the transmission line 601 (e.g. a wavelength of an antenna signal for driving the antenna). Hence, the length l of the coupled sections of the first transmission line 601 and the second transmission line 602 depends on the frequency of the power (i.e. the signals) passing through the transmission line 601.

Figure 7:
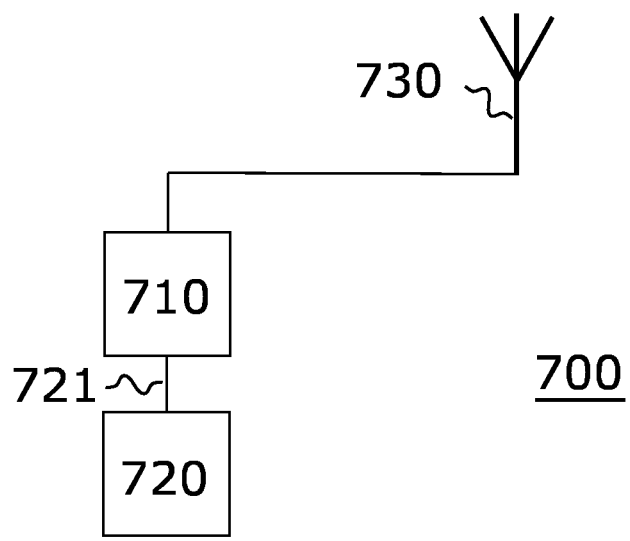
FIG. 7 illustrates an example of a base station.

An example of an implementation using a wireless communication system according to one or more aspect of the architecture described above in connection with FIGS. 1 to 6 or one or more example described above in connection with FIGS. 1 to 6 is illustrated in FIG. 7. FIG. 7 schematically illustrates an example of a radio base station 700 (e.g. for a femtocell, a picocell, a microcell or a macrocell) comprising a wireless communication system 710 as proposed.

The wireless communication system 710 is configured as described above. For illustrative purposes only, the phased array 730 of the wireless communication system 710 is illustrated as separate element in FIG. 7. The phased array 730 is indicated by a single antenna in the example of FIG. 7.

The base station 700 further comprises baseband circuitry (e.g. a baseband processor) 720 coupled to the wireless communication system 710. The baseband circuitry 720 is configured to generate a baseband signal 721. The wireless communication system 710 is configured to receive and process the baseband signal 721. Accordingly, the antenna signals supplied to the antennas of the phased array 730 are based on the baseband signal 721. For example, the baseband circuitry 720 may be configured to generate the baseband signal 721 based on data (e.g. user data) to be transmitted wirelessly.

To this end, a base station enabling DPD for a phased array may be provided.

The base station 700 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU core and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband circuitry may be implemented, for example, as a solder-down substrate including one or more integrated circuit, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellation such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

The wireless communication system and the base station according to the proposed architecture or one or more of the examples described above may be configured to operate according to one of the 3rd Generation Partnership Project (3GPP)-standardized mobile communication networks or systems. The mobile or wireless communication system may correspond to, for example, a 5$^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

In other examples, the wireless communication system and the base station according to the proposed architecture or one or more of the examples described above may be configured to operate according to a standardized wireless communication satellite system. Accordingly, the emitted radio waves may exhibit a frequency in one of the frequency bands used for satellite communication such as the L-band (approx. 1-2 GHz), the S-band (approx. 2-4 GHz), the C-band (approx. 4-8 GHz), the X-band (approx. 8-12 GHz), the Ku-band (approx. 12-18 GHz), the K-B and (approx. 18-26 GHz) or the Ka-band (approx. 26-40 GHz).

Examples of the present disclosure provide a feedback path for mmWave DPD.

The examples described herein may be summarized as follows:

An example (e.g. example 1) relates to a wireless communication system, comprising: a phased array comprising a plurality of antennas configured to emit a respective radio wave based on a respective antenna signal; a plurality of power amplifiers each coupled to a respective one of the plurality of antennas via a respective feed line and configured to output the respective antenna signal to the respective feed line; a plurality of directional couplers each coupled into a respective one of the feed lines and comprising a respective third port configured to output a fraction of a respective power received at a respective first port coupled to the respective power amplifier via the respective feed line, and a respective fourth port configured to output a fraction of a respective power received at a respective second port coupled to the respective antenna via the respective feed line; and switching circuitry configured to alternately couple the respective third port of one of the plurality of directional couplers to a first feedback receiver, and to alternately couple the respective fourth port of one of the plurality of directional couplers to a second feedback receiver.

Another example (e.g. example 2) relates to a previously described example (e.g. example 1), wherein the antenna signals are phase and/or amplitude shifted with respect to each other.

Another example (e.g. example 3) relates to a previously described example (e.g. example 1 or example 2), wherein the first feedback receiver is configured to generate a first digital feedback signal, wherein the second feedback receiver is configured to generate a second digital feedback signal, and wherein the wireless communication system further comprises: digital pre-distortion circuitry configured to pre-distort a digital transmit signal using one or more pre-distortion coefficient, wherein the antenna signals are based on the digital transmit signal; and training circuitry configured to determine the one or more pre-distortion coefficient based on the first digital feedback signal and the second digital feedback signal.

Another example (e.g. example 4) relates to a previously described example (e.g. example 3), wherein the training circuitry is configured to determine the one or more pre-distortion coefficient further based on the digital transmit signal.

Another example (e.g. example 5) relates to a previously described example (e.g. example 3 or example 4), wherein the training circuitry is configured to: determine a load modulation of the plurality of power amplifiers based on the second digital feedback signal; and determine the one or more pre-distortion coefficient based on the determined load modulation of the plurality of power amplifiers.

Another example (e.g. example 6) relates to a previously described example (e.g. one of examples 3 to 5), wherein the training circuitry is configured to: determine a far field radiation pattern of the phased array based on the first digital feedback signal; and determine the one or more pre-distortion coefficient based on the determined far field radiation pattern.

Another example (e.g. example 7) relates to a previously described example (e.g. one of examples 3 to 6), further comprising beamforming circuitry coupled to the plurality of power amplifiers, wherein the beamforming circuitry is configured to: generate a plurality of radio frequency transmit signals for the plurality of power amplifiers based on the pre-distorted digital transmit signal, wherein the plurality of power amplifiers generate the antenna signals by amplifying the plurality of radio frequency transmit signals; and adjust a phase and/or an amplitude of the radio frequency transmit signals for controlling a direction of a main beam formed by interference of the emitted radio waves.

Another example (e.g. example 8) relates to a previously described example (e.g. example 7), wherein the training circuitry is configured to determine the one or more pre-distortion coefficient using a training model for minimizing an overall non-linear distortion of the main beam.

Another example (e.g. example 9) relates to a previously described example (e.g. one of examples 3 to 8), wherein one of the plurality of power amplifiers is configured to provide no antenna signal to the respective antenna of the phased array during a time slot, wherein the switching circuitry is configured to couple the fourth port of the directional coupler coupled to the one of the plurality of power amplifiers during the time slot to the second feedback receiver, and wherein the training circuitry is configured to:

determine a near field radiation pattern of the phased array based on a signal section of the second digital feedback signal, which is generated by the second feedback receiver based on an output of the switching circuitry during the time slot; and determine the one or more pre-distortion coefficient based on the determined near field radiation pattern.

Another example (e.g. example 10) relates to a previously described example (e.g. one of examples 1 to 9), wherein the switching circuitry is configured to simultaneously couple the respective third port and the respective fourth port of the respective one of the plurality of directional couplers to the respective one of the first feedback receiver and the second feedback receiver.

Another example (e.g. example 11) relates to a previously described example (e.g. one of examples 1 to 10), wherein the radio waves are millimeter waves, and/or wherein the radio waves exhibit a frequency of 24 GHz or more.

Another example (e.g. example 12) relates to a previously described example (e.g. one of examples 1 to 10), wherein the radio waves exhibit a frequency of 6 GHz or less.

Another example (e.g. example 13) relates to a previously described example (e.g. one of examples 1 to 12), wherein at least one of the plurality of directional couplers comprises: a first transmission line coupling the respective first port and the respective second port; and a second transmission line coupling the respective third port and the respective fourth port, wherein the first transmission line and the second transmission line are spaced apart from each other at a distance enabling power passing through one the first transmission line and the second transmission line to couple into the other one of the first transmission line and the second transmission line.

Another example (e.g. example 14) relates to a previously described example (e.g. one of examples 1 to 13), wherein the plurality of antennas are patch antennas.

Another example (e.g. example 15) relates to a base station, comprising: a wireless communication system according to a previously described example (e.g. one of examples 1 to 14); and baseband circuitry coupled to the wireless communication system and configured to generate a baseband signal, wherein the antenna signals are based on the baseband signal.

Another example (e.g. example 16) relates to a previously described example (e.g. example 15), wherein the baseband circuitry is configured to generate the baseband signal based on data to be transmitted wirelessly.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A wireless communication system, comprising:
    a phased array comprising a plurality of antennas configured to emit a respective radio wave based on a respective antenna signal;
    a plurality of power amplifiers each coupled to a respective one of the plurality of antennas via a respective feed line and configured to output the respective antenna signal to the respective feed line;
    a plurality of directional couplers each coupled into a respective one of the feed lines and comprising a respective third port configured to output a fraction of a respective power received at a respective first port coupled to the respective power amplifier via the respective feed line, and a respective fourth port configured to output a fraction of a respective power received at a respective second port coupled to the respective antenna via the respective feed line; and
    switching circuitry configured to alternately couple the respective third port of one of the plurality of directional couplers to a first feedback receiver, and to alternately couple the respective fourth port of one of the plurality of directional couplers to a second feedback receiver.

2. The wireless communication system of claim 1, wherein the antenna signals are phase and/or amplitude shifted with respect to each other.

3. The wireless communication system of claim 1, wherein the first feedback receiver is configured to generate a first digital feedback signal, wherein the second feedback receiver is configured to generate a second digital feedback signal, and wherein the wireless communication system further comprises:
    digital pre-distortion circuitry configured to pre-distort a digital transmit signal using one or more pre-distortion coefficient, wherein the antenna signals are based on the digital transmit signal; and
    training circuitry configured to determine the one or more pre-distortion coefficient based on the first digital feedback signal and the second digital feedback signal.

4. The wireless communication system of claim 3, wherein the training circuitry is configured to determine the one or more pre-distortion coefficient further based on the digital transmit signal.

5. The wireless communication system of claim 3, wherein the training circuitry is configured to:
    determine a load modulation of the plurality of power amplifiers based on the second digital feedback signal; and determine the one or more pre-distortion coefficient based on the determined load modulation of the plurality of power amplifiers.

6. The wireless communication system of claim 3, wherein the training circuitry is configured to:
determine a far field radiation pattern of the phased array based on the first digital feedback signal; and
determine the one or more pre-distortion coefficient based on the determined far field radiation pattern.

7. The wireless communication system of claim 3, further comprising beamforming circuitry coupled to the plurality of power amplifiers, wherein the beamforming circuitry is configured to:
generate a plurality of radio frequency transmit signals for the plurality of power amplifiers based on the pre-distorted digital transmit signal, wherein the plurality of power amplifiers generate the antenna signals by amplifying the plurality of radio frequency transmit signals; and
adjust a phase and/or an amplitude of the radio frequency transmit signals for controlling a direction of a main beam formed by interference of the emitted radio waves.

8. The wireless communication system of claim 7, wherein the training circuitry is configured to determine the one or more pre-distortion coefficient using a training model for minimizing an overall non-linear distortion of the main beam.

9. The wireless communication system of claim 3, wherein one of the plurality of power amplifiers is configured to provide no antenna signal to the respective antenna of the phased array during a time slot, wherein the switching circuitry is configured to couple the fourth port of the directional coupler coupled to the one of the plurality of power amplifiers during the time slot to the second feedback receiver, and wherein the training circuitry is configured to:
determine a near field radiation pattern of the phased array based on a signal section of the second digital feedback signal, which is generated by the second digital feedback signal based on an output of the switching circuitry during the time slot; and
determine the one or more pre-distortion coefficient based on the determined near field radiation pattern.

10. The wireless communication system of claim 1, wherein the switching circuitry is configured to simultaneously couple the respective third port and the respective fourth port of the respective one of the plurality of directional couplers to the respective one of the first feedback receiver and the second feedback receiver.

11. The wireless communication system of claim 1, wherein the radio waves are millimeter waves, and/or wherein the radio waves exhibit a frequency of 24 GHz or more.

12. The wireless communication system of claim 1, wherein the radio waves exhibit a frequency of 6 GHz or less.

13. The wireless communication system of claim 1, wherein at least one of the plurality of directional couplers comprises:
a first transmission line coupling the respective first port and the respective second port; and
a second transmission line coupling the respective third port and the respective fourth port,
wherein the first transmission line and the second transmission line are spaced apart from each other at a distance enabling power passing through one the first transmission line and the second transmission line to couple into the other one of the first transmission line and the second transmission line.

14. The wireless communication system of claim 1, wherein the plurality of antennas are patch antennas.

15. A base station, comprising:
a wireless communication system according to claim 1; and
baseband circuitry coupled to the wireless communication system and configured to generate a baseband signal, wherein the antenna signals are based on the baseband signal.

16. The base station of claim 15, wherein the baseband circuitry is configured to generate the baseband signal based on data to be transmitted wirelessly.

* * * * *